United States Patent
Kris

(10) Patent No.: US 10,003,329 B2
(45) Date of Patent: Jun. 19, 2018

(54) SYSTEM, METHOD AND APPARATUS HAVING IMPROVED PULSE WIDTH MODULATION FREQUENCY RESOLUTION

(71) Applicant: Microchip Technology Incorporated, Chandler, AZ (US)

(72) Inventor: Bryan Kris, Phoenix, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 117 days.

(21) Appl. No.: 14/714,315

(22) Filed: May 17, 2015

(65) Prior Publication Data

US 2015/0249446 A1 Sep. 3, 2015

Related U.S. Application Data

(63) Continuation of application No. 12/697,919, filed on Feb. 1, 2010, now Pat. No. 9,035,685, which is a
(Continued)

(51) Int. Cl.
*H03K 3/017* (2006.01)
*H03K 7/08* (2006.01)
(Continued)

(52) U.S. Cl.
CPC ............. *H03K 7/08* (2013.01); *H03K 3/017* (2013.01); *H03M 1/68* (2013.01); *H03M 1/822* (2013.01)

(58) Field of Classification Search
CPC ........ H01L 2924/00; H01L 2924/1305; H03K 7/08
See application file for complete search history.

(56) References Cited

U.S. PATENT DOCUMENTS 5,300,765 A 4/1994 Mizuta ......................... 235/492
5,549,469 A 8/1996 Wild et al. ...................... 431/75
(Continued)

FOREIGN PATENT DOCUMENTS

CN 1622460 A 6/2005 ............. H03K 3/017
EP 0252541 A1 1/1988 ............. H02H 3/087
(Continued)

OTHER PUBLICATIONS

Li, Jian et al., "High Resolution Digital Duty Cycle Modulation Schemes for Voltage Regulators," Applied Power Electronics Conference, APEC 2007—22nd Annual IEEE, IEEE PI, pp. 871-876 (6 pages), Feb. 1, 2007.
(Continued)

*Primary Examiner* — Sibin Chen
(74) *Attorney, Agent, or Firm* — Slayden Grubert Beard PLLC

(57) ABSTRACT

Using a combination of frequency dithering of a PWM counter and a variable time delay circuit yields improved PWM frequency resolution with realizable circuit components and clock operating frequencies. A controllable time delay circuit lengthens a PWM signal during the first PWM cycle. During the second PWM cycle, the PWM period is increased beyond the desired amount, but the delay is reduced during this second PWM cycle to achieve the correct (desired) PWM signal period. The dithering of the PWM signal period enables the time delay circuit to be "reset" so that an infinite delay circuit is not required. The time delay circuit provides short term (one cycle) frequency adjustment so that the resulting PWM cycle is not dithered and has a period at the desired frequency resolution.

19 Claims, 4 Drawing Sheets

Related U.S. Application Data continuation of application No. 12/045,759, filed on Mar. 11, 2008, now Pat. No. 7,714,626.

(60) Provisional application No. 60/946,810, filed on Jun. 28, 2007.

(51) Int. Cl.
*H03M 1/68* (2006.01)
*H03M 1/82* (2006.01)

(56) References Cited

U.S. PATENT DOCUMENTS

| | | | |
|---|---|---|---|
| 5,776,173 A | 7/1998 | Madsen, Jr. et al. | 607/67 |
| 6,064,555 A | 5/2000 | Czajkowski et al. | 361/111 |
| 6,127,882 A | 10/2000 | Vargha et al. | 327/540 |
| 6,985,343 B2 | 1/2006 | Mirowski et al. | 361/93.2 |
| 7,017,069 B2 | 3/2006 | Kudo et al. | 713/500 |
| 7,106,110 B2 | 9/2006 | Canada et al. | 327/114 |
| 7,714,626 B2 | 5/2010 | Kris et al. | 327/175 |
| 9,035,685 B2 | 5/2015 | Kris et al. | 327/175 |
| 2004/0222866 A1 | 11/2004 | Stengel et al. | 332/109 |
| 2005/0030206 A1 | 2/2005 | Li | 341/53 |
| 2005/0110475 A1* | 5/2005 | Chapuis | H02M 1/38 323/282 |
| 2006/0221528 A1* | 10/2006 | Li | H02M 1/32 361/100 |

FOREIGN PATENT DOCUMENTS

| | | | |
|---|---|---|---|
| EP | 1357461 A2 | 10/2003 | G06F 1/28 |
| WO | 00/22500 A1 | 4/2000 | G06F 1/20 |
| WO | 2006/023427 A2 | 3/2006 | H03K 7/08 |

OTHER PUBLICATIONS

Chinese Office Action, Application No. 200880022131.2, 9 pages, dated Mar. 29, 2011.
Chinese Office Action, Application No. 200880022131.2, 6 pages, dated Feb. 22, 2012.
Korean Office Action, Application No. 102010700679, 2 pages, dated Jul. 29, 2014.
European Office Action, Application No. 08796032.4, 4 pages, dated Sep. 5, 2017.

* cited by examiner

US 10,003,329 B2

SYSTEM, METHOD AND APPARATUS HAVING IMPROVED PULSE WIDTH MODULATION FREQUENCY RESOLUTION

RELATED PATENT APPLICATION

This application is a continuation of U.S. patent application Ser. No. 12/697,919 filed Feb. 1, 2010, which is a continuation application of U.S. patent application Ser. No. 12/045,759 filed Mar. 11, 2008, which claims priority to commonly owned U.S. Provisional Patent Application Ser. No. 60/946,810 filed Jun. 28, 2007, the contents of which are hereby incorporated by reference in their entirety.

TECHNICAL FIELD

The present disclosure relates to digital devices having digital pulse width modulation (PWM) capabilities, and more particularly, to digital devices having improved PWM frequency resolution.

BACKGROUND

Power conversion techniques using pulse width modulation (PWM) controllers typically vary the duty cycle, the phase, or the frequency of the PWM signal to control the flow of power in a power supply. Analog or digital PWM controllers may be used for PWM signal generation. Regardless of the PWM signal generation technique used, the general goal is to provide as much resolution as possible to minimize the output voltage ripple in the power supply.

For analog PWM signal generation, it is difficult to generate stable and consistent frequency PWM signals over temperature, process and when subjected to a range of ambient noise conditions.

The digital generation of PWM signals with high frequency resolution is very difficult. PWM signal generators typically use a digital counter with an associated comparator and PWM period register. The frequency resolution of this typical PWM circuit is determined by the frequency of the clock signal that drives the counter. To obtain one (1) nanosecond of frequency resolution, the counter must be clocked with a 1 GHz (Billion Hertz) signal. In many technologies, this high a frequency of operation is impossible to obtain, the required power consumption is too high, and/or the cost is prohibitive.

Most common power conversion controllers are implemented with analog circuitry that do not require high frequency clocks to achieve frequency resolution. It is know in the art of power supply design to increase the clock rate of the PWM generator counter to improve frequency resolution. This approach works well at lower frequencies for applications such as motor control but becomes impractical for higher frequency power conversion circuits. Very few companies have attempted to provide microcontrollers and/or digital signal processors with high resolution digital PWM generators to serve the power conversion market. Historically, the PWM parameter that was considered important was the duty cycle (PWM pulse width). Only recently, have "resonant mode" power conversion circuits become "fashionable" because of the desire to improve the power conversion efficiency. Resonant mode power conversion uses the PWM frequency to control the flow of power, instead of the PWM duty cycle.

SUMMARY

Therefore there is a need for higher resolution of frequency in PWM systems. According to the teachings of this disclosure, a circuit is used to control variation of both the PWM period and the PWM phase in a coordinated manner so as to achieve higher resolution of PWM frequency.

In PWM systems, frequency dithering is when a PWM generator operates at two distinct frequencies in an alternating manner. The resultant effect is the arithmetic average of the two chosen frequencies. However, use of frequency dithering in a resonant mode power conversion circuit will generate ripple currents and voltages in a process called "limit cycling." This not desirable behavior in a PWM power system.

Phase shifting of a periodic signal involves changing the signal delay of a circuit as the signal is propagated through the circuit. If the delay is varied as the signal passes through the circuit, the signal will be distorted, e.g., stretched or compressed in time. Phase shifting a signal is similar to shifting a signal's frequency on a "short time" basis. However, to change a signal's frequency continuously requires an infinite delay circuit, an impossibility.

Therefore according to teachings of this disclosure, use of a combination of frequency dithering of a PWM counter and a variable delay circuit yields improved PWM frequency resolution with realizable circuit components and clock operating frequencies. For example, a controllable delay lengthens a PWM period during the first PWM cycle. During the second PWM cycle, the PWM period is increased beyond the desired amount, but the delay is reduced during this second PWM cycle to achieve the correct (desired) PWM signal period. Period is the reciprocal of frequency and both will be used herein interchangeably. The dithering of the PWM signal period enables the delay circuit to be "reset" so that an infinite delay circuit is not required. The delay element provides short term (one cycle) frequency adjustment so that the resulting PWM cycle is not dithered and has a period at the desired frequency resolution.

Another way to view this frequency/period resolution optimization, having a finer frequency control then what would normally be possible at a given clock frequency, is to consider that the least significant bits (LSBs) of the period value represent a stretching of the PWM cycle. A programmable delay circuit can add delay during a PWM cycle thus effectively lengthening the PWM cycle. But on succeeding PWM cycles, the delay circuit would need to continually add more delays thereto. This requirement becomes an impossibility after a few PWM cycles. An infinite delay element cannot be built.

After a number of stretched (delayed) PWM cycles, the PWM counter period value can be temporarily increased so that the PWM period is lengthened beyond what has been specified. To compensate for the overly long period, the delay circuit's delay can be reduced to adjust the PWM period to the specified value. This process allows the delay element to be "unwound" after it was previously "wound up."

According to a specific example embodiment of this disclosure, an apparatus having improved pulse width modulation (PWM) frequency resolution comprises: a period register (302) for storing a pulse width modulation (PWM) period value; control logic (316) coupled to a least significant bit (LSB) of the period register (302); a plus one effective period adder (306) coupled to the period register (302) and having a carry-in input coupled to the control logic (316), wherein when the carry-in input is at a first logic level, one (1) is added to the PWM period value; a period comparator (308) coupled to the plus one effective period adder (306) and receiving the PWM period value when the carry-in input is at a second logic level and the PWM period value plus one when the carry-in input is at the first logic level; a clock counter (310) for counting clock pulses from a clock source, the clock counter (310) being coupled to the period comparator (308), wherein the period comparator (308) compares a clock count from the clock counter (310) with the PWM period value or the PWM period value plus one from the plus one effective period adder (306), whereby the period comparator (308) resets the clock counter (310) when the clock count is greater than or equal to the PWM period value or the PWM period value plus one; a duty cycle register (314) for storing a PWM duty cycle; a duty cycle comparator (312) coupled to the clock counter (310) and the duty cycle register (314), wherein the duty cycle comparator (312) compares the PWM duty cycle to the clock count and whenever the clock count is less than or equal to the PWM duty cycle a first logic level is generated from an output of the duty cycle comparator (312), otherwise a second logic level is generated therefrom, thereby generating a first PWM signal; a delay element (320) coupled to the output of the duty cycle comparator (312), wherein the delay element (320) delays the first PWM signal from the duty cycle comparator (312); a multiplexer (322) coupled to the delay element and the output of the duty cycle comparator, wherein either a delayed first PWM signal or non-delayed first PWM signal is selected to produce a second PWM signal from an output of the multiplexer (322); and a delay flip-flop (318) coupled to the control logic (316) and the multiplexer (322), wherein the delay flip-flop (318) states are controlled by the control logic (316) depending on whether the delayed first PWM signal or the non-delayed first PWM signal was last selected, and the delay flip-flop (316) generates a multiplexer control signal for selection of either the delayed first PWM signal or the non-delayed first PWM signal, whereby the second PWM signal has a PWM period resolution substantially equal to a time delay of the delay element (320).

According to another specific example embodiment of this disclosure, an apparatus having improved pulse width modulation (PWM) frequency resolution comprises: a period register (402) for storing a pulse width modulation (PWM) period value, the period register having m bits of which n bits are least significant; a delay adder (430) coupled to the n least significant bits of the period register (402b); a delay register (432) coupled to the delay adder (430), wherein a value from the delay adder (430) is stored in the delay register (432) each time the delay register (432) is clocked; a plus one effective period adder (306) coupled to the period register (402a) and a carry-out from the delay adder (430), wherein when the carry-out from the delay adder (430) is at a first logic level, one (1) is added to the PWM period value from the period register (402a); a period comparator (308) coupled to the plus one effective period adder (306) and receiving the PWM period value when the carry-out from the delay adder (430) is at a second logic level and the PWM period value plus one when the carry-out from the delay adder (430) is at the first logic level; a clock counter (310) for counting clock pulses from a clock source, the counter (310) being coupled to the period comparator (308), wherein the period comparator (308) compares a clock count from the clock counter (310) with the PWM period value or the PWM period value plus one from the plus one effective period adder (306), whereby the period comparator (308) resets the clock counter (310) and clocks the delay register (432) when the clock count is greater than or equal to the PWM period value or the PWM period value plus one; a duty cycle register (314) for storing a PWM duty cycle; a duty cycle comparator (312) coupled to the clock counter (310) and the duty cycle register (314), wherein the duty cycle comparator (312) compares the PWM duty cycle to the clock count and whenever the clock count is less than or equal to the PWM duty cycle a first logic level is generated from an output of the duty cycle comparator (312), otherwise a second logic level is generated therefrom, thereby generating a first PWM signal; a plurality of multi-tap delay elements (420), the plurality of multi-tap delay elements (420) are coupled in series to produce a plurality of time delays of the first PWM signal from the duty cycle comparator (312), a first one of the plurality of multi-tap delay elements (420) being coupled to the output of the duty cycle comparator (312); and a multiplexer (322) coupled to the plurality of multi-tap delay elements (420), the output of the duty cycle comparator (312) and an output of the delay adder (430), wherein the output of the delay adder (430) controls selection of which one of the plurality of multi-tap delay elements (420) is coupled to an output of the multiplexer (322) to produce a second PWM signal, whereby the second PWM signal has a PWM period resolution substantially equal to a time delay of a single one of the plurality of multi-tap delay elements (420).

BRIEF DESCRIPTION OF THE DRAWINGS

A more complete understanding of the present disclosure may be acquired by referring to the following description taken in conjunction with the accompanying drawings wherein.

Figure 1:
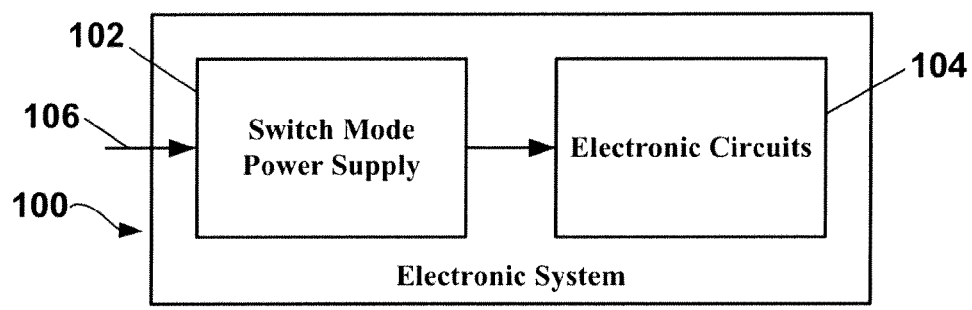
FIG. 1 illustrates a schematic block diagram of an electronic system powered by a switch mode power supply.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of an electronic system powered by a switch mode power supply. An electronic system, generally represented by the numeral 100, may comprise a power supply, e.g., switch mode power supply 102 that may supply operating voltages and currents to electronic circuits 104 of the electronic system 100. The switch mode power supply 102 may convert a power source voltage 106, e.g., 120 VAC, 48 VDC, etc., to all required operating voltages used by the electronic circuits 104.

Figure 2:
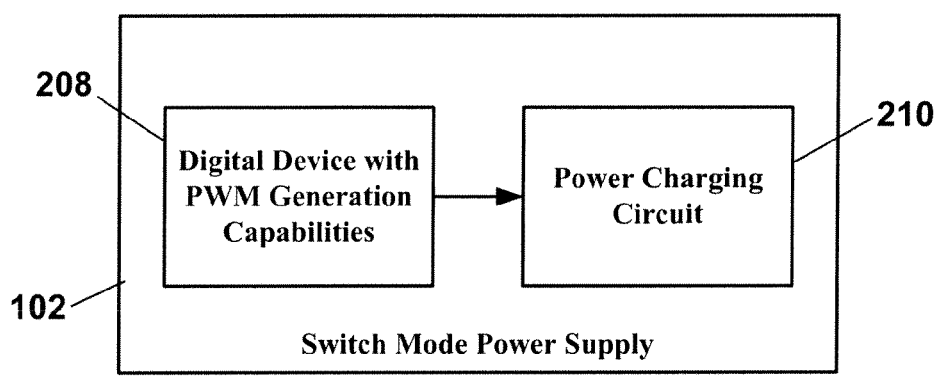
FIG. 2 illustrates a schematic block diagram of a switch mode power supply.

Referring to FIG. 2, depicted is a schematic block diagram of a switch mode power supply. The switch mode power supply 102 may comprise a PWM control circuit 208 and a power charging circuit 210. The power charging circuit 210 is controlled by the PWM control circuit 208. The PWM control circuit 208 has clock circuits that control frequency of the PWM signal(s). The power charging circuit 210 comprises at least one power switching element (not shown), e.g., power transistor, power field effect transistor, etc.

Figure 3:
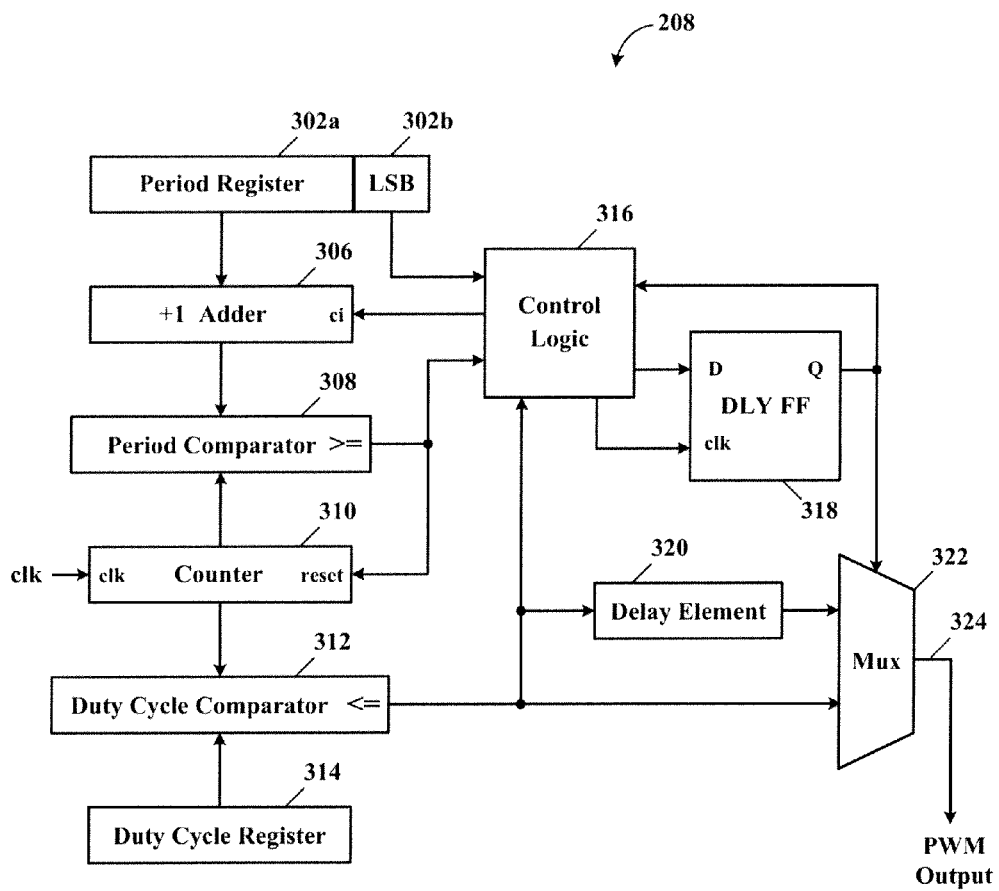
FIG. 3 illustrates a schematic block diagram of a digital PWM generator having a single bit delay, according to a specific example embodiment of this disclosure.

Referring to FIG. 3, depicted is a schematic block diagram of a digital PWM generator having a single bit delay, according to a specific example embodiment of this disclosure. The terms "period" and "frequency" are used interchangeably herein since period and frequency are the inverse of each other, if the period resolution is improved then the frequency resolution is similarly improved. The digital PWM generator 208 may comprise a period register 302, a plus one (+1) effective period adder 306, a period comparator 308, a counter 310, a duty cycle comparator 312, a duty cycle register 314, control logic 316, a delay flip-flop 318, a delay element 320 and a multiplexer 322.

According to teachings of this disclosure, the new, novel and nonobvious components of the aforementioned digital PWM generator 208 may include the plus one (+1) effective period adder 306, the control logic 316, the delay element 320 with its associated multiplexer 322, and the delay flip-flop 318. The frequency/period resolution is improved without increasing clock frequency by an "LSB" bit in a portion of the period register 302b. If the LSB bit of the period register 302b is nonzero, the control logic 316 sets the delay flip-flop 318 to select the PWM path that includes the delay element 320 following deassertion of an active PWM pulse (duty cycle). This action effectively stretches the PWM signal 324. On the next PWM cycle that has the LSB bit of the period register 302b set, the plus one (+1) effective period adder 306 will increase the PWM period specified by the PWM counter 310 by one count. This action will stretch the PWM signal too much for the desired PWM period, but then the PWM signal period is compensated by selecting the PWM output path via the multiplexer 322 that does not include the delay element 320. The action of adding one more count to the value of the counter 310 by increasing the value of the period register by one, allows the delay element 320 to be removed from the signal path, thus allowing the process to be continuously repeated for the following PWM cycles.

The programmed PWM period may be constantly changing. Therefore, the PWM period/frequency resolution enhancement circuit, according to teachings of this disclosure, has to remember previous logic states to insure that the delay element 320 does not "saturate" and that the period adjustment logic is appropriately applied. The following table indicates what occurs in the operation of the circuit disclosed in FIG. 3:

| Current | | Next | | |
|---|---|---|---|---|
| DLY | LSB | DLY | ADD1 | State |
| 0 | 0 | 0 | 0 | Initial state |
| 0 | 1 | 1 | 0 | First state |

-continued

| Current | | Next | | |
|---|---|---|---|---|
| DLY | LSB | DLY | ADD1 | State |
| 1 | 0 | 1 | 0 | Hold state |
| 1 | 1 | 0 | 1 | Second state |

Where DLY is the delay state, i.e., 1=delay and 0=no delay.

The LSB is the least significant bit of the desired period stored in the period register 302 that may change at any time.

When ADD1=1 the effective counter period is increased by one (1) increment determined by the delay element 320.

Figure 4:
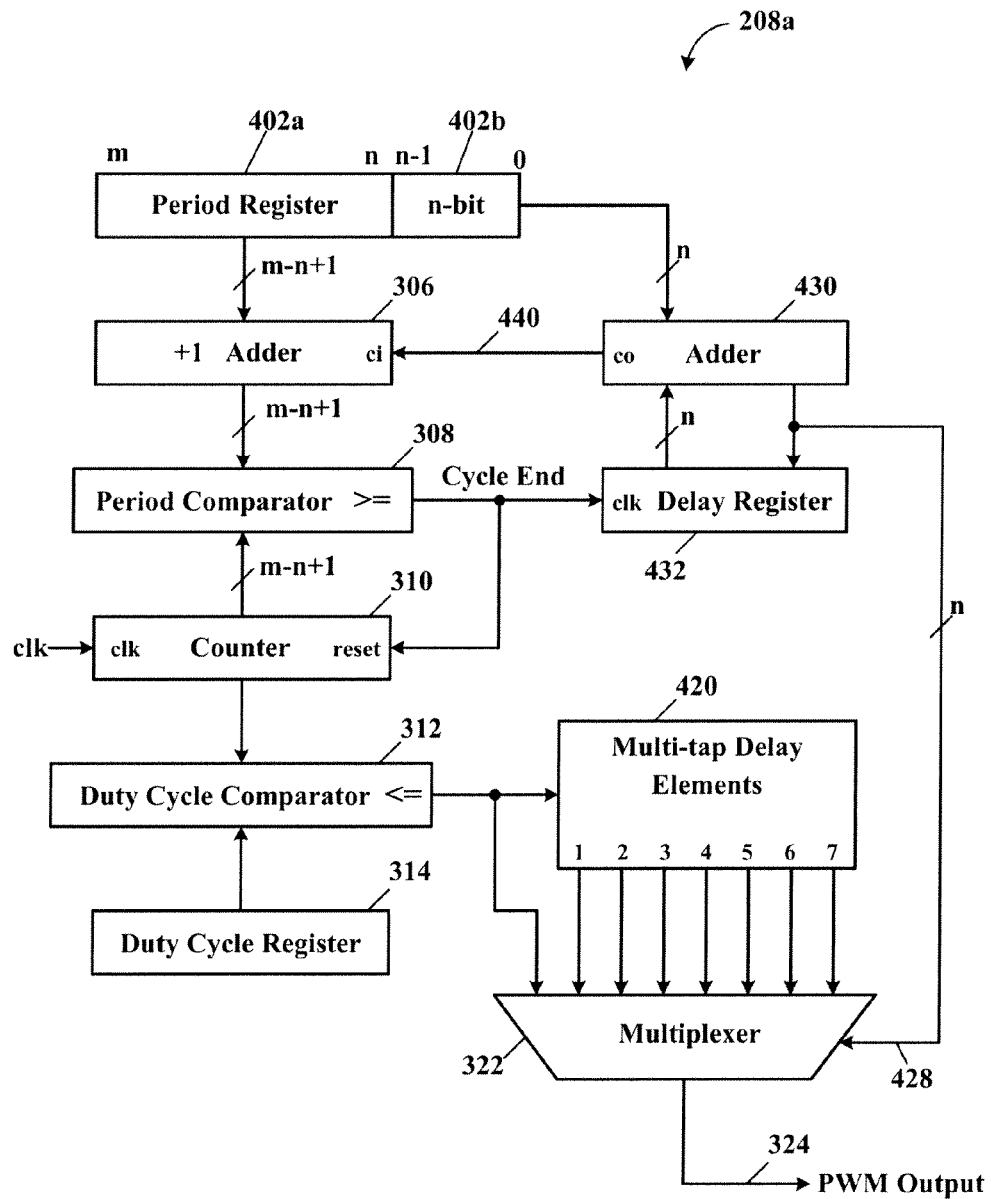
FIG. 4 illustrates a schematic block diagram of a digital PWM generator having a selectable multi-bit delay, according to another specific example embodiment of this disclosure.

Referring to FIG. 4, depicted is a schematic block diagram of a digital PWM generator having a selectable multi-bit delay, according to another specific example embodiment of this disclosure. The digital PWM generator 208a may comprise a period register 402, a plus one (+1) effective period adder 306, a period comparator 308, a counter 310, a duty cycle comparator 312, a duty cycle register 314, a multi-bit adder 430, a delay register 432, a plurality of multi-tap delay elements 420 and a multiplexer 322.

According to teachings of this disclosure, the new, novel and nonobvious components of the aforementioned digital PWM generator 208a may include the plus one (+1) effective period adder 306, the multi-bit adder 430, the delay register 432, and the plurality of multi-tap delay elements 420 with its associated multiplexer 322. An additional n-bits of frequency/period resolution are in a least significant n-bit portion of the period register 402b. When a nonzero value is in the least significant n-bit portion of the period register 402b, the plurality of multi-tap delay elements 420 are used to introduce from one to n−1 time units of delay (selectable) to the PWM signal period following deassertion of an active PWM pulse (duty cycle). This action effectively stretches the PWM signal 324 by the selected one to n−1 time units.

For illustrative purposes without creating any limitation thereby, examples of the operation of the digital PWM generator 208a for n=3 bits is described hereinbelow. One of ordinary skill in the digital arts and having the benefit of this disclosure could ready understand the operation of the PWM generator 208a for any value of n. The delay register 432 is, for this example, a three bit register (N=3). Associated with the delay register 432 is, for this example, a three bit adder 430. At the start of every PWM cycle, the adder 430 adds the contents of the delay register 432 with the least significant three bits of the period register 402b. The carry-out signal 440 from the adder 430 is coupled to the carry-in input of the plus one (+1) effective period adder 306.

The plus one (+1) effective period adder 306 does not permanently alter the contents of the period register 402. The output of the plus one (+1) effective period adder 306 provides the period value used by the time base (not shown) of the PWM generator 208a. The process of the adder 430 generating carry-out signals 440 (co) to the carry-in input (ci) of the plus one (+1) effective period adder 306 is what dithers the PWM cycle period. The least significant three bits of the period register 402b determines the rate at which period dither occurs. Thus if the least significant three bits of the period register 402b are all zeros, the PWM period will not be dithered. If the least significant three bits of the period register 402b are equal to 001 then the dither operation will occur once every eight PWM cycles. And if the least significant three bits of the period register 402b are equal to 100 then the dither operation will occur once every two PWM cycles.

While the carry-out (co) of the adder 430 controls the PWM period dithering, the three bit contents (signal bus 438) of the delay register 432 controls the delay selected from the plurality of multi-tap delay elements 420. However, updating the selection of the plurality of multi-tap delay elements 420 (through the multiplexer 322) preferably occurs during the end of the PWM cycle so as to minimize distortion of the PWM signal 324.

Control of the plus one (+1) effective period adder 306 via the carry-out (co) of the adder 430 may occur substantially at any time during the PWM cycle because the change to the PWM period is effective at the end of the PWM cycle via the period comparison circuitry (period comparator 308).

It is desirable to have the period register 402 and the duty cycle register 314 updated at the end of the PWM cycle so as to permit the PWM application, e.g., user, to update the PWM frequency (period) during the PWM cycle and the circuit logic of the PWM generator 208a respond as fast as possible to minimize control loop latency.

The delay register 432 is clocked at substantially the same time the associated time base counter 310 rolls over to zero. This occurs when the period comparator 308 resets the time base counter 310 at a cycle end.

An example of the operation of the circuit shown in FIG. 4, where m=15 and n=3, the period register 402 is 16-bits wide with the least significant 3 bits of the period register 402b is to be "processed" to yield the improved frequency resolution, according to the teachings of this disclosure. The required number of taps of the plurality of multi-tap delay elements 420 is equal to $2^n-1=7$ delay taps. If the multi-tap delay element 420 is designed for a 1 nanosecond resolution, then the seven taps provide 1, 2, 3, 4, 5, 6 or 7 nanosecond delays that are selectable through inputs 1-7 of the multiplexer 322. The multiplexer 322 also has an input (0) coupled to no delay tap, e.g., the input of the first one of the plurality of multi-tap delay elements 420 that receives the PWM signal from the output of the duty cycle comparator 312.

The adder 430 and its associated delay register 432 are also n-bits wide and add and store numbers with values from 0 to $2^n-1$. Whenever the addition of the lower n-bits of the period register 402b and the delay register 432 yields a carry-out signal 440 (overflow) of the adder 430, the main dither operation is performed via the plus one (+1) effective period adder 306. The "resetting" of the multi-tap delay element 420 tap selection is automatic in the summation process of the multi-bit adder 430.

For a specific first example, assume that the value in the lower n-bits of the period register 402b is 001 (decimal 1). The delay register 432 will contain the following decimal values: 0, 1, 2, 3, 4, 5, 6, 7. These same values represent the selected delay element tap. On the eighth cycle, the value in the delay register 432 is 0, and a carry out signal 440 is generated by the adder 430. Notice that the tap selection is now back to zero.

For a specific second example, assume that the value in the lower n-bits of the period register 402b is 010 (decimal 2). The delay register 432 will contain the following decimal values: 0, 2, 4, 6. These same values represent the selected delay element tap. On the fourth cycle, the value in the delay register 432 is 0, and a carry out signal 440 is generated by the adder 430. Notice that the tap selection is now back to zero.

For a specific third example, assume that the value in the lower n-bits of the period register 402b is 011 (decimal 3). The delay register 432 will contain the following decimal values: 0, 3, 6. These same values represent the selected delay element tap. On the third cycle, the value in the delay register 432 is (3-3-8=1), and a carry out signal 440 is generated by the adder 430. Notice that the tap selection is now back to "1." Every time the adder 430 generates a carry-out signal 440 which performs the frequency "dither", the summed value in the delay register 432 is reduced by $2^n$ or "8" in this example. This is a natural property of performing "modulo" arithmetic.

Figure 5:
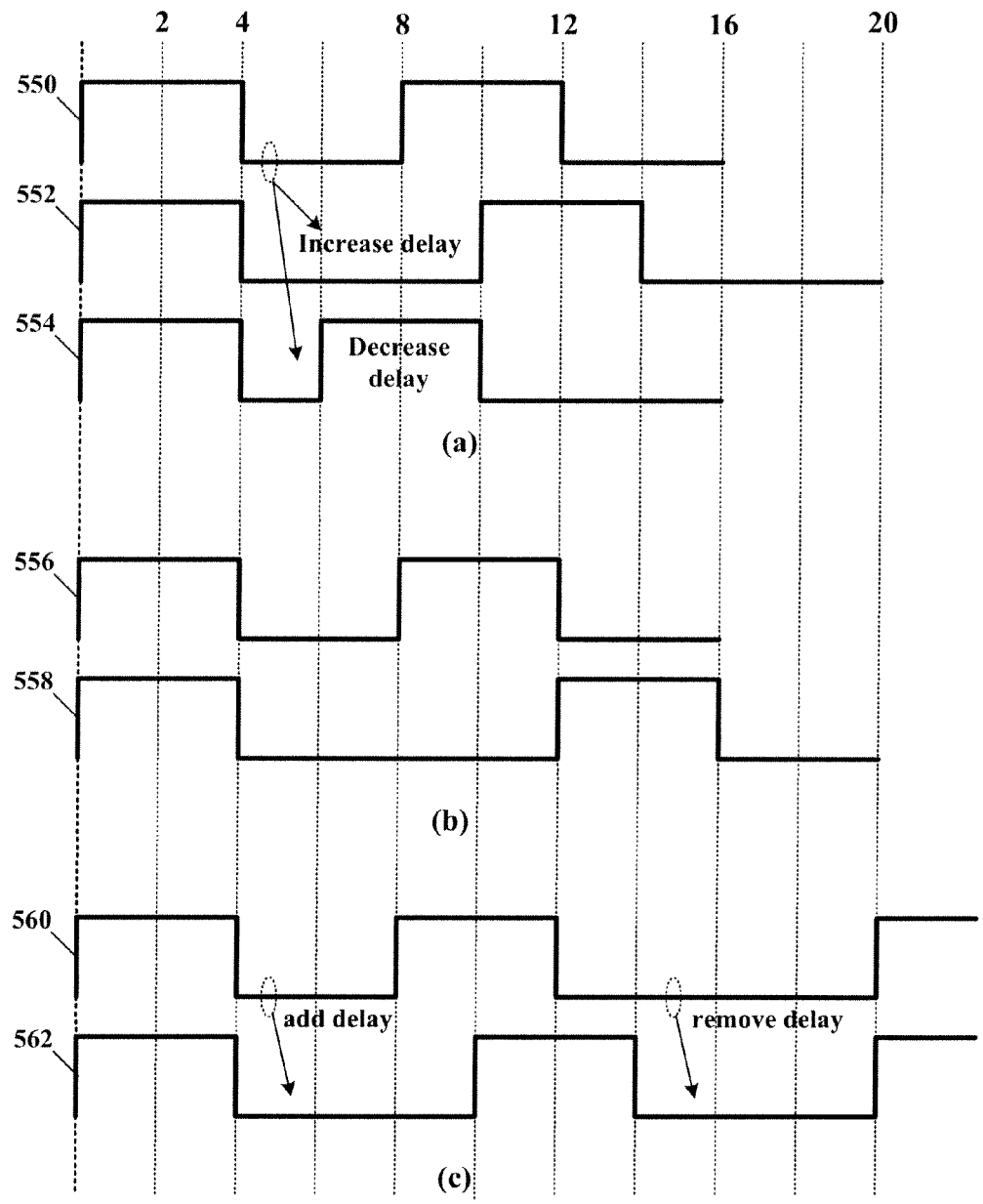
FIG. 5 illustrates schematic timing diagrams of course and fine frequency resolutions of PWM waveforms, according to teachings of this disclosure.

Referring to FIG. 5, depicted are schematic timing diagrams of course and fine frequency resolutions of PWM waveforms, according to teachings of this disclosure. The waveforms of FIG. 5(a) show how phase shifting affects PWM cycle frequency. When the waveform 550 has a phase delay of 2 time units, e.g., nanoseconds, added thereto, the resultant waveform 552 is shifted by 2 time units. Conversely, when phase delay of the waveform 550 is decreased by 2 time units, the resultant waveform 554 results. The waveforms of FIG. 5(b) show a PWM counter period adjustable by 4 time units. Waveform 558 can only be changed from the waveform 556 by increments of 4 time units which is the frequency/period resolution of the clock to the counter 310 (frequency dithering).

The waveforms of FIG. 5(c) show a PWM counter period adjustable by 2 time units, according to the teachings of this disclosure, by frequency dithering, and appropriate addition and removal of time delay to the PWM output from the duty cycle comparator 312 (e.g., by the delay element 320 and the multiplexer 322). During a first period, a 2 time unit delay is added to waveform 560 to produce the first cycle of the PWM output waveform 562. During a second period the 2 time unit delay is removed and the waveform 560 is dithered by +4 time units to produce the second cycle of the PWM output waveform 562. Since the clock frequency resolution is only 4 time units, by removing the 2 time unit delay an effective period/frequency shift of 2 time units is obtained.

This sequence of adding delay to a first PWM period value, then dithering to a longer time period second PWM period value without delay, then repeating this sequence over and over again allows finer frequency resolution of the PWM signal output 324 with a lower clock frequency. The n-bit embodiment of FIG. 4 allows even finer frequency resolution that is only limited by the number of least significant bits (n) of the period register portion 402b and the time unit resolution of the multi-tap delay element 420.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An apparatus having improved pulse width modulation frequency resolution, said apparatus comprising:
   a pulse width modulation circuit operable to generate a pulse width modulation signal comprising a first and a second period;
   a delay circuit delaying said pulse width modulation signal;

a multiplexer receiving said pulse width modulation signal and said delayed pulse width modulation signal; and control logic coupled with said multiplexer, the control logic for:
selecting either said pulse width modulation signal or said delayed pulse width modulation signal depending on the selected period of said pulse width modulation signal, wherein the pulse width modulated output signal of said multiplexer has a third period which lies between said first and second period; and
selecting in alternating sequence said pulse width modulation signal and said delayed pulse width modulation signal to generate the pulse width modulated output signal of said multiplexer with the third period which lies between said first and second period.

2. The apparatus according to claim 1, comprising:
a period register for storing a pulse width modulation period value wherein the control logic is coupled to a least significant bit of the period register;
a plus one effective period adder coupled to the period register and having a carry-in input coupled to the control logic, wherein when the carry-in input is at a first logic level, one is added to the PWM period value;
a period comparator coupled to the plus one effective period adder and receiving the PWM period value when the carry-in input is at a second logic level and the PWM period value plus one when the carry-in input is at the first logic level;
a clock counter for counting clock pulses from a clock source, the clock counter being coupled to the period comparator, wherein the period comparator is configured to:
compare a clock count from the clock counter with the PWM period value or the PWM period value plus one from the plus one effective period adder; and
reset the clock counter when the clock count is greater than or equal to the PWM period value or the PWM period value plus one to generate said first or second period;
a duty cycle register for storing a PWM duty cycle;
a duty cycle comparator coupled to the clock counter and the duty cycle register, wherein the duty cycle comparator is configured to compare the PWM duty cycle to the clock count and whenever the clock count is less than or equal to the PWM duty cycle a first logic level is generated from an output of the duty cycle comparator;
a delay element coupled to the output of the duty cycle comparator, wherein the delay element is configured to delay the first PWM signal from the duty cycle comparator; and
a multiplexer coupled to the delay element and the output of the duty cycle comparator, wherein either a delayed first PWM signal or non-delayed first PWM signal is configured to be selected to produce a second PWM signal from an output of the multiplexer;
wherein:
the delay circuit comprises a delay flip-flop coupled to the control logic and the multiplexer, wherein the delay flip-flop states are configured to be controlled by the control logic depending on whether the delayed first PWM signal or the non-delayed first PWM signal was last selected; and
the delay flip-flop is configured to generate a multiplexer control signal for selection of either the delayed first PWM signal or the non-delayed first PWM signal, whereby the second PWM signal has a PWM period resolution substantially equal to a time delay of the delay element.

3. The apparatus according to claim 2, wherein the clock count time period is configured to be substantially twice the time period of the delay element time delay.

4. The apparatus according to claim 2, further comprising a power charging circuit for use as a switch mode power supply.

5. The apparatus according to claim 4, further comprising electronic circuits powered by the switch mode power supply, wherein the electronic circuits and the switch mode power supply are used in an electronic system.

6. The apparatus according to claim 1, comprising:
a period register for storing a pulse width modulation period value, the period register having m bits of which n bits are least significant;
a delay adder coupled to the n least significant bits of the period register;
a delay register coupled to the delay adder, wherein a value from the delay adder is stored in the delay register each time the delay register is clocked;
a plus one effective period adder coupled to the period register and a carry-out from the delay adder, wherein when the carry-out from the delay adder is at a first logic level, the plus one effective period adder is configured to add one to the PWM period value from the period register;
a period comparator coupled to the plus one effective period adder and configured to:
receive the PWM period value when the carry-out from the delay adder is at a second logic level; and
receive the PWM period value plus one when the carry-out from the delay adder is at the first logic level;
a clock counter for counting clock pulses from a clock source, the counter being coupled to the period comparator, wherein the period comparator is configured to compare a clock count from the clock counter with the PWM period value or the PWM period value plus one from the plus one effective period adder, whereby the period comparator is configured to reset the clock counter and clocks the delay register when the clock count is greater than or equal to the PWM period value or the PWM period value plus one;
a duty cycle register for storing a PWM duty cycle;
a duty cycle comparator coupled to the clock counter and the duty cycle register, wherein the duty cycle comparator is configured to compare the PWM duty cycle to the clock count and whenever the clock count is less than or equal to the PWM duty cycle a first logic level is generated from an output of the duty cycle comparator; and
a plurality of multi-tap delay elements, the plurality of multi-tap delay elements are coupled in series and configured to produce a plurality of time delays of the first PWM signal from the duty cycle comparator, a first one of the plurality of multi-tap delay elements being coupled to the output of the duty cycle comparator;
wherein the multiplexer is coupled to the plurality of multi-tap delay elements, the output of the duty cycle comparator and an output of the delay adder, wherein the output of the delay adder is configured to control selection of which one of the plurality of multi-tap delay elements is coupled to an output of the multiplexer to produce a second PWM signal, whereby the second PWM signal has a PWM period resolution substantially equal to a time delay of a single one of the plurality of multi-tap delay elements.

7. The apparatus according to claim 6, further comprising a power charging circuit for use as a switch mode power supply.

8. The apparatus according to claim 6, wherein the clock count time period is configured to be substantially $2^n$ times the time period of the delay element time delay.

9. The apparatus according to claim 1, further comprising a power charging circuit for use as a switch mode power supply.

10. The apparatus according to claim 9, further comprising electronic circuits powered by the switch mode power supply, wherein the electronic circuits and the switch mode power supply are used in an electronic system.

11. An apparatus having improved pulse width modulation frequency resolution, said apparatus comprising:
a pulse width modulation circuit operable to generate a pulse width modulation signal comprising a first and a second period;
a delay circuit delaying said pulse width modulation signal;
a multiplexer receiving said pulse width modulation signal and said delayed pulse width modulation signal; and
control logic coupled with said multiplexer for:
selecting either said pulse width modulation signal or said delayed pulse width modulation signal depending on the selected period of said pulse width modulation signal, wherein the pulse width modulated output signal of said multiplexer has a third period which lies between said first and second period;
selecting said delayed pulse width modulation signal to add a delay to a first PWM period value; and
subsequently selecting said pulse width modulation to dither to a longer PWM time period without delay;
wherein selecting said delayed pulse width modulation signal and said pulse width modulation in alternate fashion generates the pulse width modulated output signal of said multiplexer with the third period which lies between said first and second period.

12. The apparatus according to claim 11, further comprising a power charging circuit for use as a switch mode power supply.

13. A method for improving pulse width modulation frequency resolution, said method comprising the steps of:
generating a pulse width modulation (PWM) signal comprising a first and second period;
delaying the PWM signal by a delay time to generate a delayed PWM signal;
selecting in alternating sequence either the PWM signal or the delayed PWM signal to form a PWM output signal having a third period which lies between said first and second period.

14. The method according to claim 13, wherein the step of generating the PWM signal comprises the steps of:
(a) clocking a counter;
(b) generating a first period by comparing a counter value with a predetermined period value and resetting said counter when said comparison is true;
(c) generating a second period by comparing the counter value with the predetermined period value plus 1 and resetting said counter when said comparison is true; and
(d) comparing said counter value with a duty cycle value to generate the PWM signal.

15. The method according to claim 14, further comprising the step of providing said predetermined period value in a register having m bits wherein m-n+1 bits are used to define said period predetermined value and further comprising the step of adding the remaining n bits wherein the result of said adding controls the step of generating the second period.

16. The method according to claim 15, wherein the step of delaying comprises delaying the PWM signal by a plurality of delay elements thereby generating a plurality of delayed PWM signals and the step of selecting comprises selecting either said PWM signal or one of said plurality of delayed PWM signals depending on the result of said adding step.

17. The method according to claim 16, where the second period is substantially the first period plus $2^n$ times a one of the plurality of time delays.

18. The method according to claim 13, wherein the second period is substantially the first period plus twice the delay time.

19. A method for improving pulse width modulation frequency resolution, said method comprising the steps of:
generating a pulse width modulation signal comprising a first and second period;
delaying the PWM signal by a delay time to yield a delayed PWM signal;
dithering the PWM signal to yield a longer PWM time period without delay;
selecting in alternate fashion either the PWM signal or the delayed PWM signal to form a PWM modulated signal having a third period which lies between said first and second period.

* * * * *